United States Patent
Ouellette et al.

(10) Patent No.: US 7,474,575 B2
(45) Date of Patent: Jan. 6, 2009

(54) APPARATUS FOR TESTING A MEMORY OF AN INTEGRATED CIRCUIT

(75) Inventors: Michael R. Ouellette, Westford, VT (US); Jeremy Rowland, Savannah, GA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/875,009

(22) Filed: Oct. 19, 2007

(65) Prior Publication Data

US 2008/0037340 A1 Feb. 14, 2008

Related U.S. Application Data

(60) Division of application No. 11/160,268, filed on Jun. 16, 2005, now Pat. No. 7,304,901, which is a continuation of application No. PCT/US02/040473, filed on Dec. 16, 2002.

(51) Int. Cl.
*G11C 29/00* (2006.01)
*G11C 7/00* (2006.01)

(52) U.S. Cl. ........................ 365/201; 365/200

(58) Field of Classification Search ............ 365/200 X, 365/201 O, 200, 201; 714/723, 710, 711, 714/7, 8; 711/202, 207, 221
See application file for complete search history.

(56) References Cited

U.S. PATENT DOCUMENTS

| 4,819,205 | A | 4/1989 | McRoberts |
| 5,838,623 | A | 11/1998 | Pascucci |
| 5,907,514 | A | 5/1999 | Lee et al. |
| 5,936,907 | A | 8/1999 | Pascucci |
| 6,367,042 | B1 | 4/2002 | Phan et al. |
| 6,640,321 | B1 | 10/2003 | Huang et al. |
| 6,691,264 | B2 | 2/2004 | Huang |
| 6,728,910 | B1 * | 4/2004 | Huang ................... 714/711 |

FOREIGN PATENT DOCUMENTS

JP 4-228196 8/1992

* cited by examiner

*Primary Examiner*—VanThu Nguyen
(74) *Attorney, Agent, or Firm*—Ira D. Blecker; Wenjie Li

(57) ABSTRACT

An apparatus for testing a memory of an integrated circuit for a defect. The apparatus includes a test unit for testing a redundant memory element only when the redundant memory element has been enabled to replace a failed memory element.

11 Claims, 4 Drawing Sheets

APPARATUS FOR TESTING A MEMORY OF AN INTEGRATED CIRCUIT

CROSS-REFERENCE TO RELATED APPLICATIONS

This application is a divisional of currently co-pending U.S. patent application Ser. No. 11/160,268, filed on Jun. 16, 2005, which is a continuation of PCT Application Number PCT/US02/40473, filed on Dec. 16, 2002. The subject matter of both related applications PCT/US02/40473 and 11/160,268 are incorporated herein by reference.

BACKGROUND OF THE INVENTION

1. Technical Field

The present invention relates generally to enablement of memory redundancy.

2. Background Art

Memory arrays in general, and static random access memories (SRAM) specifically, account for most of the silicon area on many application specific integrated circuit (ASIC) chips. These memory arrays often hurt manufacturing yields on these chips because they are such a large percentage of the chip and they tend to push the limits of a technology's manufacturing process. However, their very repetitive and predictable design lends itself well to methods of repairing the memories after the chip is manufactured. The typical approach to memory repair is to include extra, or "redundant," rows or columns which will be "swapped" with memory elements which have defects. Conventional methods for testing and repairing fixed-design SRAM memory arrays which include row, i.e., wordline, redundancy fall into three general categories.

One technique stipulates testing all the redundant memory elements at the same time as the general memory elements (i.e., prior to fuse-blow,) and marks a chip as non-repairable if any redundant memory element fails. This technique is favored because there is a substantial cost associated with repairing a chip. Accordingly, the sooner a chip can be identified as "not fixable," the more money can be saved in the test process because failing redundant elements will not be found at module test. However, this solution is inefficient and costly because defects found in redundant memory elements that are not needed to repair a chip will result in repairable chips being thrown away.

A second technique for testing redundant memory elements is to wait until after failing general memory elements have been replaced with redundant memory elements (i.e., after fuse-blow,) and testing the redundant memory elements as if they were the general memory elements which they are replacing. This technique is favored over the first technique because repairable chips are not thrown away when defects are found in unused redundant memory elements. However, this technique does not identify failing redundant memory elements until after fuse-blow, thus incurring the added costs of test time, fuse-blow, and possibly packaging into a module (which often comprises half the cost of a chip or more).

Finally, a third technique stipulates testing all redundant memory elements prior to replacing general memory elements, as in the first technique, but provides an additional mechanism by which failing redundant memory elements are identified and mapped around when replacing general memory elements. This technique saves test cost by reducing or eliminating the number of failing redundant memory elements after fuse-blow and identifying non-repairable chips early in the test process. However, additional costs of silicon chip area and test complexity are introduced. This extra cost is justifiable in a high-density memory array such as a dynamic RAM (DRAM,) but is not acceptable for higher-performance, lower-density memories such as SRAMs and register arrays (RAs). An additional cost is the extra test time incurred in testing the chip again at the same conditions after the memory elements have been replaced, as in the second technique.

Compilable (or customizable) memory presents further obstacles to implementing and testing redundant memory elements. For instance, testing and mapping around failed redundant memory elements is much more cumbersome in a compilable memory design.

In view of the foregoing, there is a need in the art for more efficient methods and apparatuses for testing and repairing redundant memory elements during testing.

BRIEF SUMMARY OF THE INVENTION

In a first aspect, the invention relates to an apparatus for testing a memory of an integrated circuit for a defect. The apparatus comprises a test unit for testing a redundant memory element only when the redundant memory element has been enabled to replace a failed memory element.

BRIEF DESCRIPTION OF THE SEVERAL VIEWS OF THE DRAWINGS

The embodiments of this invention will be described in detail, with reference to the following figures, wherein like designations denote like elements, and wherein.

DETAILED DESCRIPTION OF THE INVENTION

Figure 1:
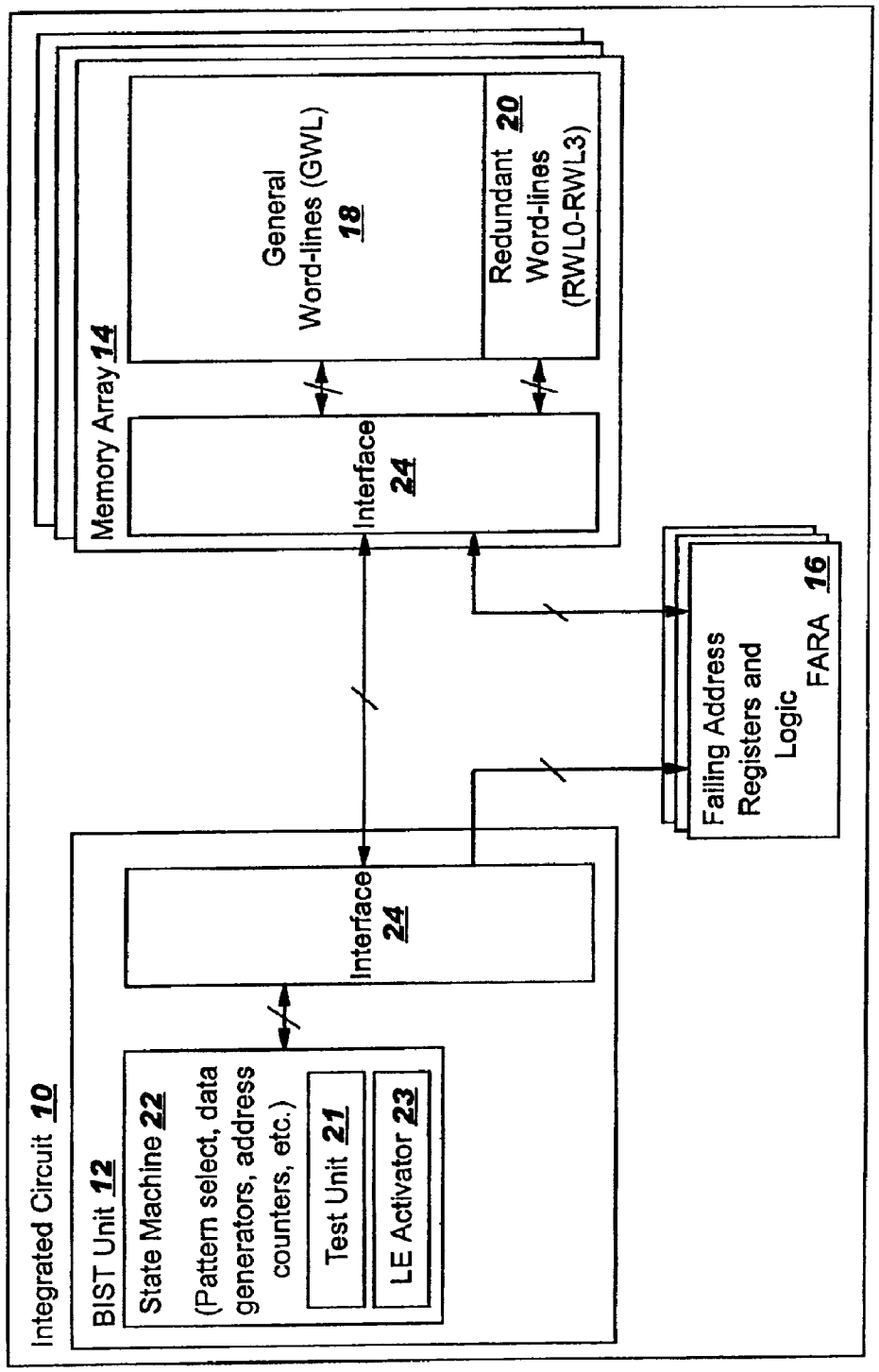
FIG. 1 shows a block diagram of an integrated circuit having a BIST of an embodiment of the invention.

Referring to the drawings, methods and apparatuses for enabling redundancy during memory testing will now be described relative to an SRAM application. It should be recognized, however, that the teachings of the invention are applicable to any type of memory. As shown in FIG. 1, an integrated circuit 10 (IC) includes, inter alia, a memory built-in self test (BIST) unit 12 that is mated with one or more memory arrays 14 along with each memory's corresponding failing address register array (FARA) 16. Each memory array 14 may include a specific design of a plurality of general wordlines or memory elements 18 (hereinafter "GWL") and a set of redundant wordlines or memory elements 20 (hereinafter "RWL"). GWLs are those memory elements initially intended for operation, and RWLs are memory elements provided to replace failing memory elements (GWLs or RWLs). By "replace" is meant an RWL is swapped for or exchanged for the failing memory element. Alternatively, each memory array 14 may take the form of a compilable (or customizable) memory design in which the number of the plurality of GWLs 18 and the set of RWLs 20 can be user selected.

Figure 2:
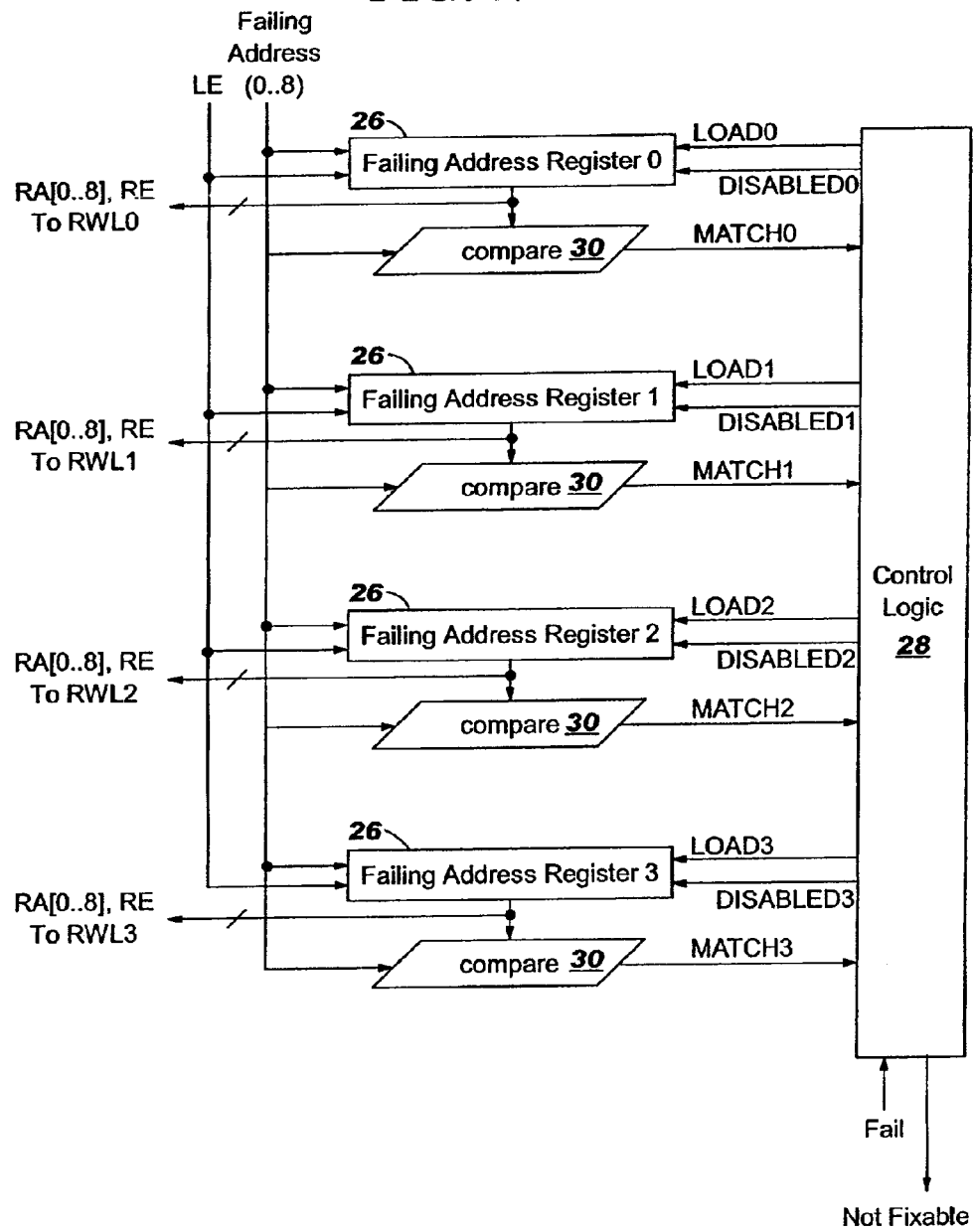
FIG. 2 shows a block diagram of a failing address repair register (FARA) of FIG. 1.

BIST unit 12 includes a state machine 22 that includes, inter alia, a test unit 21 for implementing a self test of memory array 14 in which values are written to enabled memory elements (i.e., GWLs and enabled RWLs) and then read back. Test unit 21 then determines whether a failure exists by comparing the output of the memory elements during a read operation with the values written thereto. If the output does not match, a fail signal is activated (generated). BIST unit 12 may include common functions such as write pattern selects, data generators, address counters, etc., to carry out the self test. In addition, BIST unit 12 includes a load-enable signal (LE) activator 23, which is configured to determine an appropriate time(s), or point(s), during testing at which to change redundancy status, i.e., enable/disable RWLs can be activated without causing a false failure. The details of LE activator 23 will be described below. BIST unit 12 and memory array 14 each may include appropriate interfaces 24. FARA 16 includes a set of failing address registers (FAR) 26 and control logic 28 (FIG. 2). Each memory array 14 may include an associated FARA 16, or a group of memory arrays 14 may share a FARA 16. Although FARA 16 is shown as a separate entity, it should be recognized that FARA 16 may be provided as part of a memory array 14.

An exemplary FARA 16 that implements four RWLs and no redundant bit-lines (columns) is shown in more detail in FIG. 2. FARA 16 includes one failing address register (FAR) 26 for each RWL. Each of the four FARs, denoted FAR0 to FAR3, feed to a respective RWL, denoted RWL0 to RWL3. Control logic 28 may output to each FAR 26 a LOAD signal and a DISABLE signal, as will be described below. Control logic 28 also receives the fail signal from memory array 14 and outputs a not-fixable signal if memory array 14 is incapable of being repaired. While four RWLs/FARs are shown, it should be recognized that a memory array 14 may implement any number of RWLs/FARs necessary.

Figure 3:
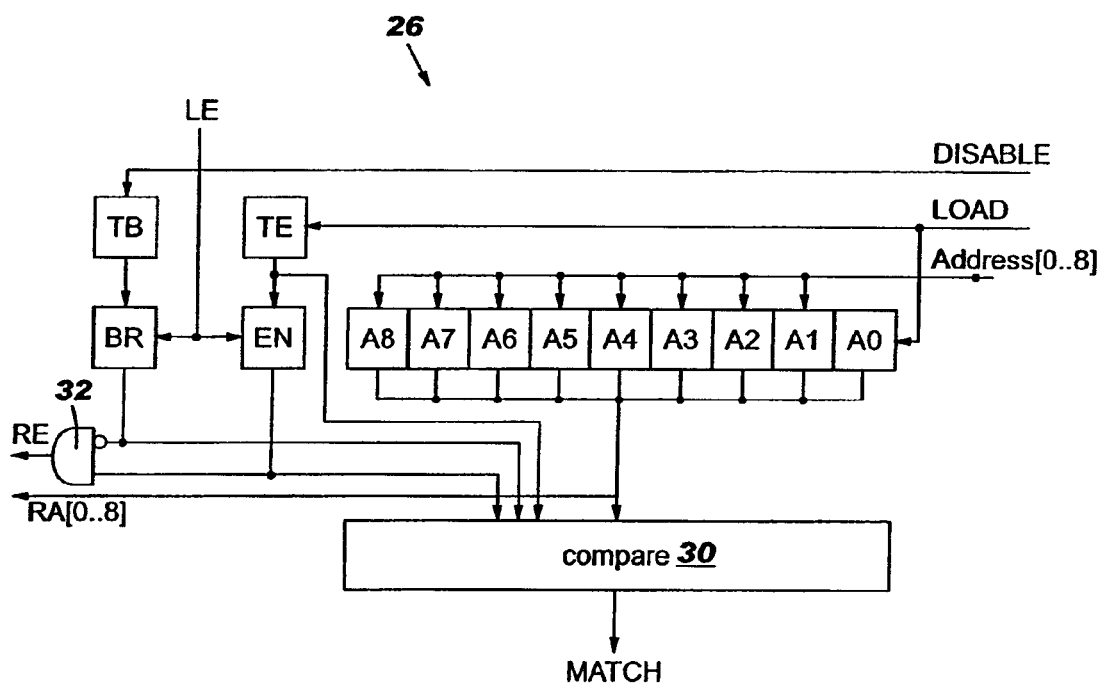
FIG. 3 shows a block diagram of failing address register (FAR) of FIG. 2.

A detail of a FAR 26 is shown in FIG. 3. Each FAR 26 includes n Address bits A0-An (in FIG. 3, n=8), and the following control bits or latches: enable EN, temporary-enable TE, bad-redundancy BR and temporary bad-redundancy TB. Address bits A0-An contain an address location of a failing memory element to be replaced by an RWL. Enable bit EN controls whether the memory element whose address location is contained in the address bits A0-An is to be replaced with a corresponding redundant memory element, i.e., it activates the FAR and enables a corresponding RWL. Temporary-enable TE is for holding a value to be loaded into the enable bit EN in response to the load-enable signal, i.e., it indicates that the corresponding RWL of the FAR 26 will be activated when LE activator 23 determines it is appropriate by activating the load-enable signal. Bad-redundancy bit BR, when set, overrides enable bit EN via AND gate 32, i.e., when set, it disables FAR 26 and the corresponding RWL. Temporary bad-redundancy bit TB is for holding a value to be loaded into bad-redundancy bit BR in response to the load-enable signal, i.e., when set, it indicates that the FAR and the corresponding RWL will be disabled when LE activator 23 determines it is appropriate by activating the load-enable signal.

Each FAR 26 includes a corresponding compare logic section 30 and receives the load-enable signal LE, when active, and a failing address. Further, a LOAD signal from FARA control logic 28 feeds to temporary-enable bit TE and address bits A0-An, and a DISABLE signal from logic 28 feeds to temporary bad-redundancy bit TB. Load-enable signal LE feeds to enable bit EN and bad-redundancy bit BR. Temporary-enable bit TE feeds to enable bit EN and to FAR compare logic 30, and temporary bad-redundancy bit TB feeds to bad-redundancy bit BR. When the load-enable signal LE is active, the value of temporary enable bit TE is forced to enable bit EN if the enable bit EN is not set, and forces the value of temporary bad-redundancy bit TB to bad-redundancy bit BR if the bad-redundancy bit is not set. If the respective bit (EN or BR) is already set, the corresponding temporary bit (TE or TB, respectively) is ignored. Enable bit EN feeds to an AND gate 32 and bad-redundancy bit BR feeds to AND gate 32 after inversion. Accordingly, a resulting memory enable signal RE is controlled ultimately by bad-redundancy bit BR, i.e., BR bit, when set, overrides the value of enable bit EN. Enable bit EN and bad-redundancy bit BR each feed to FAR compare logic section 30. Address bits A0-An are coupled to compare logic section 30 and to memory array 14 (via the RA signal). A memory enable signal RE is also coupled from the operand of AND gate 32 to memory 14.

For purposes of description, "not set" means the bit has a value of "0" and "set" means the bit has a value of "1." However, it should be recognized that the logic can be designed such that the bits are active low, i.e., "set"="0" and "not set"="1," without affecting the spirit of the invention. In addition, a setting or state of "X" means that the bit has either not had a value written thereto or the value is not immediately relevant to the description.

Figure 4:
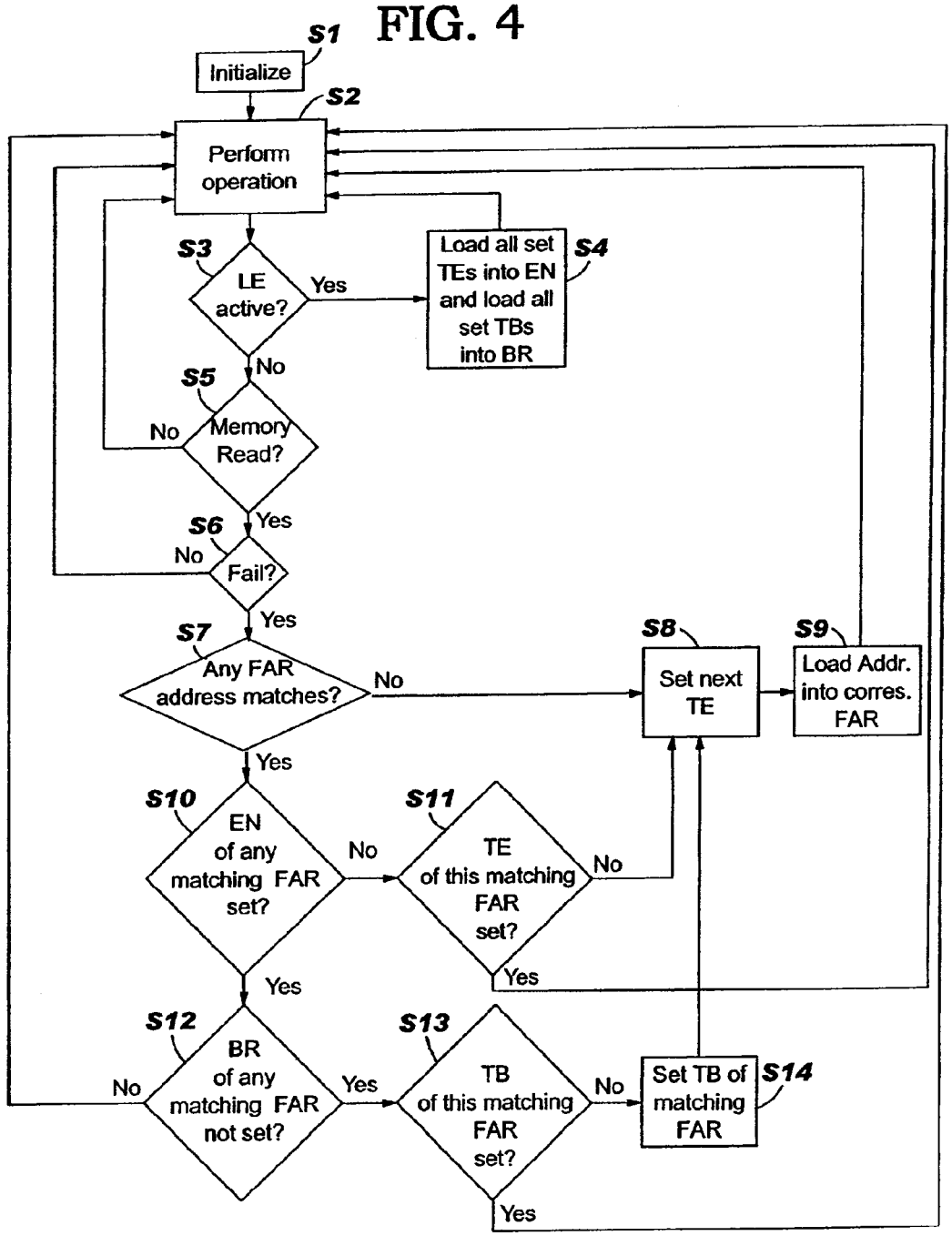
FIG. 4 shows a flow diagram of operation of the invention.

Referring to FIG. 4, operation of the invention will now be described. It should be recognized that while a step-by-step description will be provided, not all of the steps may be necessary to the methodology. Further, operation of the invention may be stated in other steps than as described by grouping of steps.

In a first step S1, FARA 16 is initialized to one of two states. In a first initialization state: control bits TE, TB, EN and BR are not set, i.e., 0, for all FARs 26. Address bits A0-An are considered in an "X" state. In practice, however, address registers A0-An are usually set to a known value, e.g., all "0." Alternatively, in a second initialization state: some or all FARs 26 are loaded with a previous redundancy solution. For example, A0-An contain address data, enable bit EN is set, bad-redundancy bit BR is set (or not set), and temporary-enable and temporary bad-redundancy bits TE and TB are set to "X." The remaining (i.e., unused) FARs 26 are initialized as "not set" according to the first state above.

In a second step S2, an operation is performed by test unit 21. In this step, test unit 21, as described above, writes values to enabled memory elements (i.e., GWLs and enabled RWLs) and then reads the values back. Test unit 21 then determines whether a failure exists by comparing the output of the memory elements during the read operation with the written values. If the output does not match, a fail signal is activated (generated). In one embodiment, test unit 21 is configured to test each active memory element by sequentially writing different, i.e., multiple, patterns to the memory elements and then reading them back to determine whether the data was stored correctly. Exemplary patterns may include blanket 0s, blanket 1s, checkerboard, reverse checkerboard, word-line stripes, bit-line stripes, etc. As will become evident below, the sequential testing allows for repair of failing memory elements and then testing of the RWLs used to make the repair.

In step S3, a determination is made whether a timing-controlled load-enable (LE) signal has been made active by LE activator 23. When load-enable (LE) signal is active, i.e., set, it indicates that an appropriate time/point at which to change redundancy status of FARs 26 exists. During testing, when a failure in a GWL is detected, test unit 21 may not recognize the failure for a number of machine cycles. If an RWL is enabled upon immediate detection of a failure, a subsequent machine cycle may read that RWL when nothing has been written to it. Accordingly, test unit 21 will indicate a failure of that RWL even though nothing is wrong with it. The load-enable (LE) signal prevents this false-failure from occurring by determining when it is appropriate to change the status of an RWL, e.g., from disabled to enabled or enabled to disabled. An appropriate time may be, for example, just prior to when test unit 21 is about to begin a write to all addresses and after test unit 21 has evaluated the failure status of all previous read operations.

In step S4, if the load-enable signal is active, all set temporary-enable bits TE are loaded into corresponding enable bits EN that are not already set, and all set temporary bad-redundancy bits TB are loaded into corresponding bad-redundancy bits BR that are not already set. That is, FARs 26 are signaled to change redundancy status. As noted above, if the respective bit (EN or BR) is already set, the corresponding temporary bit (TE or TB, respectively) is ignored. The implications of this step will be described in further detail below.

In step S5, a determination is made as to whether memory array 14 is being accessed (read). If it is not, logic returns to step S2 and further testing. If memory is operative, logic proceeds to step S6 in which a determination is made as to whether a failure of a memory element has been detected. A failure is detected, as described above relative to test unit 21, when an address does not read back the data that was written to it. If a failure has not been detected, operation continues with the testing at step S2.

If a failure is detected, operation proceeds to step S7 in which a fail signal is forwarded to FAR compare logic sections 30 and a determination is made as to whether the failed memory element address matches any previously detected failed memory element addresses. That is, the failed memory element address is compared by each FAR's compare logic section 30 to the respective address bits A0-An stored therein to determine whether the failure is a newly detected failure or one that has been previously detected. If the failed memory element address matches an address stored in one of the FARs 26, a match signal is forwarded to FARA control logic 28 indicating that the failure is not a newly detected failure and operation proceeds to step S10, which is discussed below. However, if the failed memory element address does not match any address stored in any of the FARs 26, it indicates that the failure has not been detected before, i.e., it is a new failure. In this case, temporary-enable bit TE for the next available FAR/RWL is set, step S8, and the failed memory element address is loaded into the corresponding FAR for that RWL, step S9. The temporary-enable bit setting and address loading are made via the LOAD signal from FARA control logic 28. By setting temporary-enable bit TE for the next RWL, the next time LE activator 23 determines that an appropriate time to implement redundancy status change exists, the temporary-enable bit TE for this RWL is loaded into enable bit EN to enable the RWL. Accordingly, the need for replacement of a failing memory element can be noted, and enablement withheld until an appropriate time to prevent a false failure caused by the enabled RWL being read during test when nothing has been written thereto.

Turning to step S10, a determination is made as to whether the enable bit EN for any matching FAR 26 is set. This step is provided to handle situations that arise because of the initialization states of FARA 16. In particular, each of the four control bits (EN, TE, BR, TB) are initialized to a 'not set' state and address bits A0-An are initialized to some value. The situation may occur when testing detects a failure in an address that matches one or more of the initialization addresses. For example, one or more initialization addresses may be all 0s and testing may detect a failure in a GWL with address 0000 0000, resulting in one or more matching addresses. In this case, the system still must be able to load the failing address into FARA 16. The step S10 determination of whether the enable bit EN for any matching address (could be more than one) is set indicates whether the failure has actually been loaded. If none of the enable bits EN for any matching address has been set, it indicates that the failure has not been loaded permanently, and operation proceeds to step S11.

In step S11, a determination is made as to whether temporary-enable bit TE for this singular matching FAR is set, i.e., any duplication of the matching FAR is ignored. If temporary-enable bit TE is set, it indicates that repair of this failure is underway and awaiting enablement via load-enable signal LE, i.e., awaiting an appropriate time to change redundancy status. In this case, operation proceeds with the next machine cycle by continuing testing at step S2. However, if temporary-enable bit TE is not set, it indicates that this failure has not been loaded. In this case, temporary-enable bit TE for the next available FAR 26 is set, at step S8, and the failed memory element address is loaded into the corresponding FAR 26 address bits, at step S9, so that repair by activation of the corresponding RWL can be made when load-enable signal LE is activated.

Returning to step S10, if enable bit EN of any matching FAR is set, it indicates that this failure has been loaded and operation proceeds to step S12. At step S12, a determination is made as to whether bad-redundancy bit BR for any matching FAR (may be more than one) is not set. If the bad-redundancy bit BR for all matching FARs are set, it indicates that this failure was by a previously enabled RWL which also failed, i.e., a disabled or dead RWL. Repair of this RWL failure will have been completed with another RWL or may be awaiting repair via activation of load-enable signal LE. In this case, operation proceeds with the next machine cycle by continuing testing at step S2. If bad-redundancy bit BR for any matching FAR is not set, it indicates that this failure is of an enabled RWL that is newly detected on this machine cycle or is awaiting disabling by activation of load-enable signal LE, and operation proceeds with step S13.

At step S13, a determination is made as to which of the above scenarios is present by determining whether temporary bad-redundancy bit TB for this singular matching FAR is set. If temporary-enable bit TB is set, it indicates that the RWL failure is simply awaiting load-enable signal LE to change the status of the RWL to bad. In this case, operation proceeds with testing at step S2. If, however, temporary bad-redundancy bit TB is not set, it indicates that this RWL failure is newly detected on this machine cycle and, at step S14, temporary bad-redundancy bit TB of the matching FAR is set, i.e., by the DISABLE signal from FARA control logic 28. Subsequently, the next available FAR 26 temporary-enable bit TE is set, at step S8, and the address is loaded into the corresponding FAR 26 address bits so that repair by activation of the corresponding RWL can be made when load-enable signal LE is activated.

Overall operation of the invention can be stated as follows: If a fail is observed, a fail signal (FIG. 2) is transmitted from memory array 14 to FARA control logic 28. The failing address is compared to the contents of every FAR 26 in FARA 16, and logic 28 issues a LOAD signal to the next available empty register according to the following cases:

Case 1: If the failing address does not match the contents of any FAR 26, then the failing address is loaded into the next available FAR, and the corresponding temporary enable bit TE bit of the next available FAR is set.

Case 2: If the failing address matches at least one FAR address and both temporary-enable bit TE and enable bit EN for each matching FAR 26 are not set, then the failing address is loaded into the next available FAR, and the corresponding temporary-enable bit TE of the next available FAR is set.

Case 3: If the failing address matches one FAR, and enable bit EN for this FAR 26 is set, and both the temporary bad-redundancy bit TB and bad-redundancy bit BR for each matching FAR are not set, then the failing address is loaded into the next available FAR, the corresponding temporary-enable bit TE of the next available FAR is set and temporary bad-redundancy bit TB for this matching FAR is set.

In all other cases, none of the FAR contents are updated.

At some point(s) during test, LE activator 23 activates load-enable signal LE which forces the value of temporary-enable bit TE to load into enable bit EN and resets temporary-enable bit TE. When enable bit EN is set to a "1" and bad-redundancy bit BR is not set "0," AND gate 32 enables (via redundancy enable (RE) signal) the RWL in memory array 14 to replace this address, i.e., the redundant address (RA). Similarly, when LE activator 23 activates load-enable signal LE, it forces the value of temporary bad-redundancy bit TB to load into bad-redundancy bit BR and resets temporary bad-redundancy bit TB. In this case, when enable bit EN is set to "1" and bad-redundancy bit BR is set to "1," AND gate 30 disables (via redundancy enable (RE) signal) the RWL in memory array 14, i.e., BR overrides EN.

The above-described invention provides a number of advantages. First, the invention enables redundancy implementation on-the-fly by controlling the timing(s) of enablement during the multiple pattern test, thus preventing false failures based on premature enablement of redundancy. As a result, memory element failures can be repaired during a single, multiple-pattern self-test. Second, the method and apparatus allow a user to repair memory during start up of an IC through the BIST rather than just during manufacture. This functionality allows repair of reliability failures that occur long after manufacture is complete, hence, preventing IC return to the manufacturer. Third, testing of both general memory elements (GWL) and only redundant memory elements that have been enabled to replace a failed memory element makes testing more efficient. Finally, the inclusion and use of temporary enable TE and temporary bad TB bits allows use of the same latches for collecting failing addresses and implementing the redundancy to replace them. As a result, a number of options are now possible relative to fuses: 1) they can be removed and repairs simply completed during BIST, 2) they can be retained and used as a starting point for BIST, or 3) results of repairs completed by BIST can be hardwired in fuses with further self-test perhaps following this step.

In the previous discussion, it will be understood that the method steps discussed are performed by hardware contained within IC 10 and by a set of registers and control hardware. However, it is understood that the various devices, modules, mechanisms and systems described herein may be realized in hardware or software, or a combination of hardware and software, and may be compartmentalized other than as shown. They may be implemented by any type of computer system or other apparatus adapted for carrying out the methods described herein. A typical combination of hardware and software could be a general-purpose computer system with a computer program that, when loaded and executed, controls the computer system such that it carries out the methods described herein. Alternatively, a specific use computer, containing specialized hardware for carrying out one or more of the functional tasks of the invention could be utilized. The present invention can also be embedded in a computer program product, which comprises all the features enabling the implementation of the methods and functions described herein, and which—when loaded in a computer system—is able to carry out these methods and functions. Computer program, software program, program, program product, or software, in the present context mean any expression, in any language, code or notation, of a set of instructions intended to cause a system having an information processing capability to perform a particular function either directly or after the following: (a) conversion to another language, code or notation; and/or (b) reproduction in a different material form.

While the invention has been described in conjunction with several preferred embodiments, those skilled in the art will recognize that the invention can be practiced in various versions within the spirit and scope of the following claims.

INDUSTRIAL APPLICABILITY

The invention is useful for testing and implementing redundant memory elements in any memory and particularly in an SRAM.

What is claimed is:

1. An apparatus for testing a memory of an integrated circuit for a defect, the apparatus comprising:
   a test unit for testing whether a memory element in the memory is failing and generating a fail signal in response thereto, a redundant memory element being tested only when the redundant memory element has been enabled to replace a failed memory element;
   a failing address register for containing an address location of a failing memory element to be replaced by a redundant memory element, the failing address register having an enable bit for controlling whether the memory element whose address location is contained in the failing address register is to be replaced with a corresponding redundant memory element and having a temporary enable bit for holding a value to be loaded into the enable bit upon a load-enable signal; and
   a load-enable signal activator for providing a load-enable signal to load the value of the temporary enable bit into the enable bit so as to enable the redundant memory element.

2. The apparatus of claim 1, wherein the failed memory element is another redundant memory element.

3. The apparatus of claim 1, wherein the load-enable signal activator controls the timing of redundancy implementation during operation of the test unit.

4. The apparatus of claim 1, wherein the test unit also tests a non-redundant memory element.

5. An apparatus for testing a memory of an integrated circuit for a defect, the apparatus comprising:
   a test unit for testing whether each of a plurality of memory elements in the memory is failing and generating a fail signal in response thereto, a redundant memory element being tested only when the redundant memory element has been enabled to replace a failed memory element;
   a failing address register for containing an address location of a failing memory element to be replaced by a redundant memory element, the failing address register having an enable bit for controlling whether the memory element whose address location is contained in the failing address register is to be replaced with a corresponding redundant memory element and having a temporary enable bit for holding a value to be loaded into the enable bit upon a load-enable signal; and
   a load-enable signal activator for providing a load-enable signal to load the value of the temporary enable bit into the enable bit so as to enable the redundant memory element wherein the load-signal is provided at a predetermined time after all the memory has been tested for failures.

6. The apparatus of claim 5 wherein the predetermined time is just prior to the time the test unit is about to begin to write to all address locations and after the test unit has evaluated the failure status of all previous testing.

7. The apparatus of claim 5, wherein the failed memory element is another redundant memory element.

8. An apparatus for testing a memory of an integrated circuit for a defect, the apparatus comprising:

a test unit for testing whether each of a plurality of memory elements in the memory is failing and generating a fail signal in response thereto, a redundant memory element being tested only when the redundant memory element has been enabled to replace a failed memory element;

a failing address register for containing an address location of a failing memory element to be replaced by a redundant memory element, the failing address register having an enable bit for controlling whether the memory element whose address location is contained in the failing address register is to be replaced with a corresponding redundant memory element and having a temporary enable bit for holding a value to be loaded into the enable bit upon a load-enable signal; and a load-enable signal activator for providing a load-enable signal to load the value of the temporary enable bit into the enable bit so as to enable the redundant memory element wherein, an operational sequence comprises, the plurality of memory elements are tested, the address location of each failing memory element is contained in a failing address register, the corresponding temporary enable bit is set to the value and at a predetermined time after all of the memory elements have been tested, the temporary enable bit is loaded into the enable bit and the redundant memory element is loaded into memory.

9. The apparatus of claim 8 wherein the predetermined time is just prior to the time the test unit is about to begin to write to all address locations and after the test unit has evaluated the failure status of all previous testing.

10. The apparatus of claim 8, wherein the failed memory element is another redundant memory element.

11. The apparatus of claim 8, wherein the operational sequence is repeated until all memory elements including all enabled redundant memory elements are tested.

* * * * *